United States Patent [19]
Frei et al.

[11] Patent Number: 5,296,736
[45] Date of Patent: Mar. 22, 1994

[54] LEVELED NON-COPLANAR SEMICONDUCTOR DIE CONTACTS

[75] Inventors: John K. Frei, Mesa; Howard D. Knuth, Tempe; Bruce R. Tegge, Scottsdale, all of Ariz.

[73] Assignee: Motorola, Inc., Schaumburg, Ill.

[21] Appl. No.: 993,563

[22] Filed: Dec. 21, 1992

[51] Int. Cl.$^5$ .............. H01L 23/02; H01L 23/12; H01L 39/02; H01L 23/48
[52] U.S. Cl. .................. 257/668; 257/703; 257/701
[58] Field of Search .............. 257/635, 778, 703, 705, 257/706, 668, 701

[56] References Cited

U.S. PATENT DOCUMENTS

| | | | |
|---|---|---|---|
| 3,617,817 | 11/1971 | Kawakatsu et al. | 317/234 R |
| 3,628,105 | 12/1971 | Sarai et al. | 257/668 |
| 3,893,159 | 7/1975 | Martin | 357/70 |
| 4,200,880 | 4/1980 | Frey | 357/51 |
| 4,417,392 | 11/1983 | Ibrahim et al. | 29/840 |
| 4,551,747 | 11/1985 | Gilbert et al. | 357/74 |
| 4,827,082 | 5/1989 | Horiuchi et al. | 174/52.4 |

FOREIGN PATENT DOCUMENTS

| | | | |
|---|---|---|---|
| 53-31672 | 10/1977 | Japan | 257/703 |
| 62-26846 | 2/1987 | Japan | 257/703 |
| 2-97041 | 4/1990 | Japan | 257/703 |

OTHER PUBLICATIONS

IBM TDM vol. 23 No. 3 Aug. 1980, C-4 Package for Programmable Read-Only Memory, S. B. Greenspan.

Primary Examiner—Jerome Jackson
Assistant Examiner—T. M. Arroyo
Attorney, Agent, or Firm—Gregory J. Gorrie; Robert M. Handy

[57] ABSTRACT

A semiconductor assembly which includes a carrier and a semiconductor die is mounted on a printed wiring board. The die includes a top active surface and a bottom active surface. The two active surfaces are non-coplanar. The carrier is made from layers of a ceramic material. Holes are formed through all but one of the layers. The layers are laminated into an integral substrate, and the substrate is fired. The holes form a cavity into but not through the substrate. The number of layers, lamination pressures, and firing parameters are all adjusted in response to the thickness of the die to insure that the height of cavity walls approximately equals the thickness of the die. Continuous metallization is applied in the cavity and on a top surface of the substrate. The die is bonded in the cavity, and conductive bumps are formed on the die and the metallization.

16 Claims, 5 Drawing Sheets

LEVELED NON-COPLANAR SEMICONDUCTOR DIE CONTACTS

TECHNICAL FIELD OF THE INVENTION

The present invention relates generally to semiconductor chip carriers. More specifically, the present invention relates to chip carriers for adapting semiconductor non-coplanar bonding pads or contacts to printed circuit boards.

BACKGROUND OF THE INVENTION

Electrical circuit designers often face the problem of needing to implement electrical circuits using as little space as is practical. Circuit space is often a valuable asset which needs to be conserved, and the miniaturization of electrical circuits often improves speed, reduces noise, and leads to other performance advantages. The packages within which semiconductors are housed play a large role in determining the space needed for implementing an electrical circuit because larger packages require more space.

Traditionally, semiconductors have been housed in packages which consume an order of magnitude or more area than the actual semiconductor die which represents the electrical component. When an electrical circuit requires several semiconductor components, the circuit requires an amount of space dictated by the components' packages and interconnections between the packages.

"Flip chip" or direct chip attachment mounting techniques are used to increase the density of electrical circuits. Flip chip mounting techniques relate to "flipping" an integrated circuit semiconductor die over and directly attaching a single active or top surface of the die to a printed wiring board. The attachment conventionally occurs through solder bumps formed on the metalized pads or contacts of the die. Since the actual semiconductor die size is so much smaller than a typical semiconductor package, tremendous improvements in electrical circuit space requirements can result.

However, various types of semiconductors have two active surfaces rather than just one. In the case of a transistor, a collector contact usually resides on one surface of the die while emitter and base contacts reside on an opposing surface of the die. In the case of a diode, an anode contact usually resides on one surface of the die while a cathode contact resides on an opposing surface of the die. Such components cannot simply be flipped over and attached to a printed wiring board because electrical coupling will not be made between the printed wiring board and one of the active surfaces.

Moreover, when electrical circuits include both planar contact devices and non-coplanar contact devices, flip chip manufacturing processes become more complicated. Such processes must be able to attach planar contact semiconductor dice to printed wiring boards using flip chip techniques and attach semiconductor packages to the printed wiring boards using conventional semiconductor package handling techniques. These complicated manufacturing processes are more expensive and more prone to errors than would be the case were the manufacturing processes required to accommodate only flip chip attachment techniques.

SUMMARY OF THE INVENTION

Accordingly, it is an advantage of the present invention that an improved carrier for a semiconductor die having non-coplanar contacts is provided.

Another advantage of the present invention is that an apparatus and method are provided for converting a semiconductor die having non-coplanar contacts into a semiconductor assembly having substantially leveled or planar contacts.

Another advantage of the present invention is that an apparatus and method are provided which can readily adapt to accept a variety of semiconductor die thicknesses.

Another advantage of the present invention is that a carrier is provided which allows a semiconductor die having non-planar contacts to be mounted to a printed wiring board using flip chip techniques while consuming only a small amount of the board's area.

The above and other advantages of the present invention are carried out in one form by a carrier for leveling non-coplanar semiconductor die contacts. The carrier includes a substrate having an external surface and a cavity therein. The cavity is bordered by the substrate's cavity walls. The cavity walls extend from the substrate's external surface a predetermined distance into an interior of the substrate. The cavity is also bordered by a cavity floor of said substrate that extends between the cavity walls. A substantially continuous conductive layer overlies the cavity floor, at least a portion of the cavity walls, and a portion of the external surface that resides near the cavity.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

In the following description of preferred embodiments, certain items are either similar to or mirror images of other items. This description distinguishes such items from their counterparts by the use of lower case alphabetic characters ("a", "b", and so on) which are appended to a common reference number. When an alphabetic character is omitted, the description refers to any one of such items and their counterparts individually or to all of them collectively.

DETAILED DESCRIPTION OF THE PREFERRED EMBODIMENTS

Figure 1:
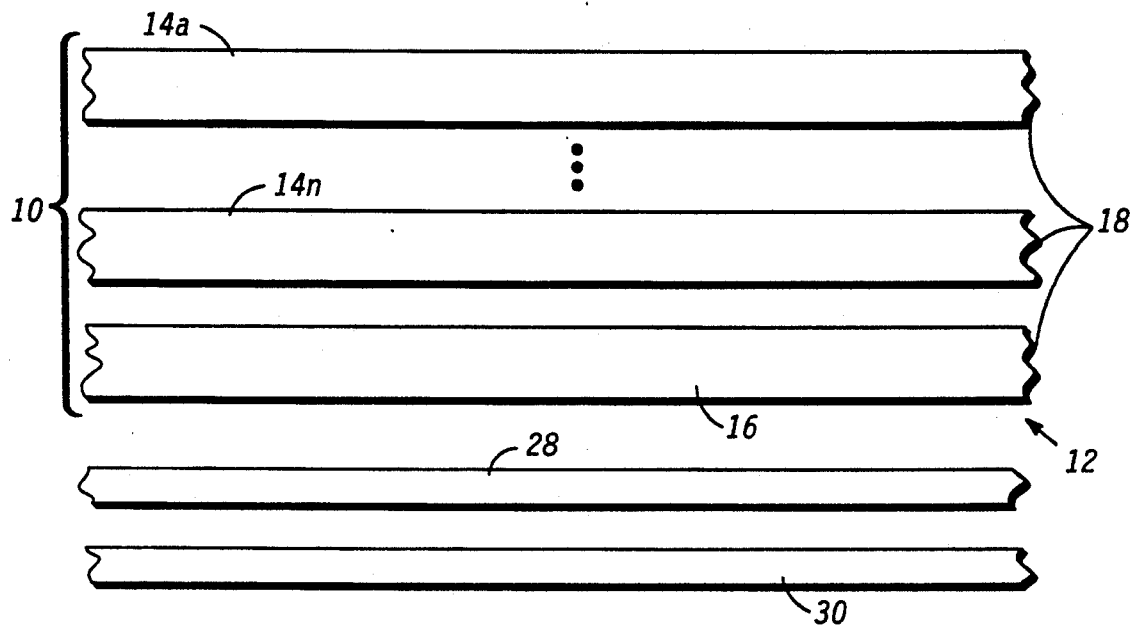
FIG. 1 shows a partial cross sectional side view of various layers of materials utilized in connection with the formation of an array of semiconductor die carriers after a first stage in the formation of the carriers.

FIG. 1 depicts a first stage in a process for forming an array 10 of semiconductor die carriers 12. FIG. 1 shows a cross sectional side view of top layers 14a through 14n and a bottom layer 16 of an insulating material 18. In subsequent stages, sheets 14 and 16 are laminated together into an integral substrate for carriers 12. In the preferred embodiment, material 18 is, for example, a green, or unfired, ceramic material available in several different thicknesses and conveniently held together through organic binders (not shown) but other attachment means may also be used.

Figure 2:
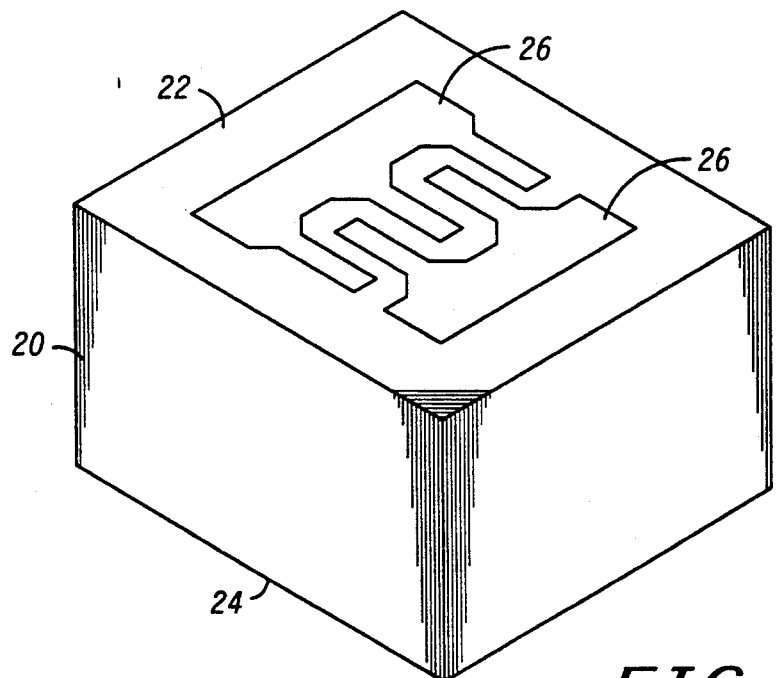
FIG. 2 shows a perspective view of a representative semiconductor die having non-planar contacts.

FIG. 2 shows a perspective view of a representative semiconductor die 20 having non-coplanar contacts. Those skilled in the art will appreciate that die 20 represents any one of a wide variety of different semiconductor dice, that the teaching of the present invention applies to many different semiconductor die configurations, and that the present invention is not limited to the configuration of die 20 illustrated in FIG. 2. Die 20 has a top active surface 22 and a bottom active surface 24. Surfaces 22 and 24 are desirably parallel to each other. Contacts 26 reside on top surface 22. Other contacts (not shown) reside on bottom surface 24. Electrical couplings between die 20 and other electrical components (not shown) occur through these contacts.

FIG. 2 illustrates a configuration wherein die 20 is a typical transistor. Thus, contacts 26 on top surface 22 serve as emitter and base nodes of the transistor. A collector node resides on bottom surface 24. However, die 20 may also be a diode. For a diode, a single cathode resides on one of surfaces 22 and 24 and a single anode resides on the other one of surfaces 22 and 24. Those skilled in the art will appreciate that the particular type of semiconductor device represented by die 20 is an unimportant feature in the present invention and that die 20 may be other types of semiconductor devices which have contacts on two non-coplanar surfaces, like surfaces 22 and 24.

In one embodiment of the present invention, a particular die 20 is selected during the first stage. When die 20 has been selected, a thickness for die 20 can be determined. The thickness represents the distance over which top and bottom surfaces 22 and 24 are spaced apart. Typically, thickness is a non-critical parameter in the manufacturing of semiconductors. Thus, semiconductor manufacturers often omit specifications for die thickness, and thickness may vary from manufacturer to manufacturer, from device to device, from batch to batch for a common device, and even from wafer to wafer within a batch. However, a single wafer may include hundreds or thousands of dice, each of which exhibits the same thickness. Accordingly, carriers may be made for a great number of dice in a single batch process.

With reference back to FIG. 1, all of sheets 14 and 16 are the same thickness in the preferred embodiments of the present invention for the sake of convenience, but nothing requires equal thicknesses. In the preferred embodiments, each of sheets 14 and 16 has a thickness of around 4.0 mils. When green ceramic sheets are used and fired, firing at a nominal temperature of, for example, around 860° C., shrinkage in material 18 causes the thickness after firing to be around 3.5 mils. However, other types of insulating materials which do not necessarily undergo shrinkage may also be used.

In this first stage, the number of top layers 14 to include in the array 10 is determined. The number of top layers 14 is chosen so that the combined thicknesses of top layers 14 (e.g. after firing) will come as close as possible to equaling the thickness of die 20 (see FIG. 2). Any number of top layers 14 may be used, with typical semiconductor dice requiring 2–4 layers. Preferably, the chosen quantity of top layers 14 causes the combined thickness of the top layers (e.g. after firing) to be within ±2.5 mils of the thickness of die 20, and more preferably within ±1.75 mils of the thickness of die 20. Since layers 14 each exhibit a thickness of around 3.5 mils (e.g. after firing at a nominal temperature) a discrete number of layers 14 causes any difference in thicknesses between fired top layers 14 and die 20 to fall within the ±1.75 mils range.

The thickness of bottom layer 16 bears no relation to the thickness of die 20. As is discussed below, bottom layer 16 needs to be sufficiently thick to maintain structural integrity and shape after lamination. Desirably, bottom layer 16 is no thicker than necessary in order to minimize the volume of space occupied by carrier 12. A single 4.0 mil thick layer of, for example, green ceramic material 18 appears to accomplish these goals for a wide variety of semiconductor dice. However, those skilled in the art may vary the thickness of bottom layer 16 in particular applications.

Each of top layers 14 and bottom layer 16 is approximately the same size as the others and large enough to accommodate the entirety of array 10. In the preferred embodiment, array 10 is around two inches by two inches, but this size may vary from application to application. Hundreds of individual carriers 12 for typical semiconductor dice may be formed within a single two inch by two inch array 10 in a common processing batch.

FIG. 1 additionally depicts sheets 28 and 30, which are made from a material, such as Mylar, that will not stick to material 18. Sheets 28 and 30 are approximately the same size as sheets 14 and 16. The first stage of the process is complete after the appropriate number of top layers 14 have been obtained with bottom layer 16 and non-stick sheets 28 and 30.

Figure 3:
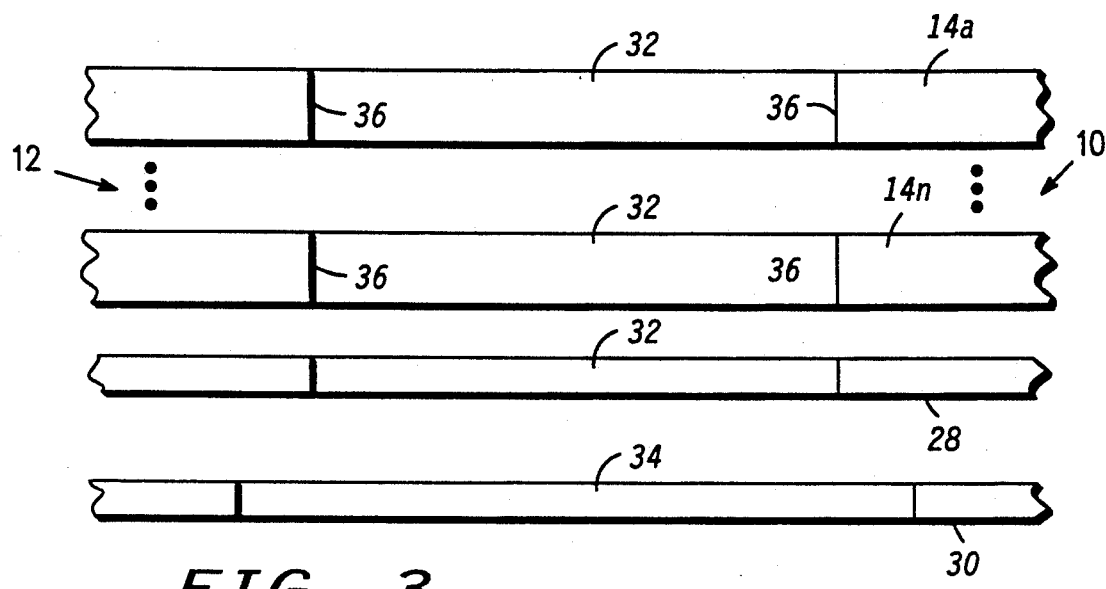
FIG. 3 shows a partial cross sectional side view of a portion of the various layers after a second stage.

FIG. 3 illustrates a second stage in the process of forming array 10 of carriers 12. The second stage forms holes 32 in top layers 14 and Mylar sheet 28, and forms holes 34 in Mylar sheet 30. In the preferred embodiment, holes 32 and 34 are punched through top layers 14 and sheets 28 and 30 by a computerized punch. One hole 32 through top layers 14 and sheet 28 and one hole 34 through sheet 30 are punched for each carrier 12 in array 10, with additional holes being punched for alignment as needed. FIG. 3 illustrates only a portion of array 10 around a single carrier 12. Thus, FIG. 3 illustrates only one hole 32 for each of top layers 14 and sheet 28 and only one hole 34 for sheet 30.

A common pattern is used in forming holes 32 and 34. In other words, the same spatial relationships which exist between holes 32 or 34 in one of top layers 14 and sheets 28 and 30 exist for all of the other ones of top layers 14 and sheets 28 and 30. In fact, nothing prevents the punching of holes 32 through top layers 14 and sheet 28 in one operation and the punching of holes 34 through sheet 30 in another operation. Preferably, holes 32 and 34 for all of carriers 12 within array 10 (see FIG. 2) are punched in this second stage. Thus, hundreds or thousands of holes 32 and 34 may be punched for the entire array 10.

Cavity walls 36 surround holes 32 in top layers 14. Holes 32 are dimensioned to accommodate die 20 after firing or other curing process. Die 20 typically exhibits a cross section in a plane parallel to top and bottom active surfaces 22 and 24 thereof (see FIG. 2) that substantially resembles a square or rectangle of a predetermined area. The shape and area of holes 32 are configured so that die 20 can fit through holes 32 after firing material 18. In other words, holes 32 are slightly larger in all dimensions than surfaces 22 of die 20 after firing or curing material 18. Hole 34 is dimensioned to have a shape similar to the shape of holes 32 and a cross sectional area slightly larger than the cross sectional areas of holes 32. Holes 32 may exhibit any practical shape, such as a circular, elliptical, or square shape.

No holes are punched in bottom layer 16 (see FIG. 1). Thus, layer 16 remains a substantially continuous planar member.

Figure 4:
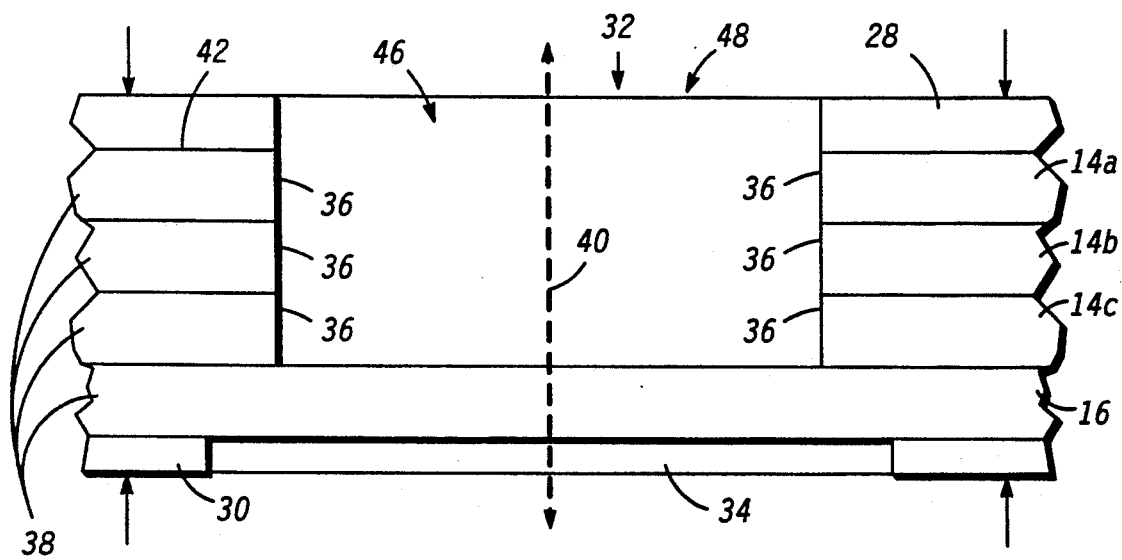
FIG. 4 shows a partial cross sectional side view of a portion of the various layers after a third stage.

FIG. 4 shows a cross sectional side view of a portion of array 10 after a third stage in the formation process. In this third stage, top layers 14 and bottom layer 16 are pressed or laminated together to form an integral substrate unit 38. Prior to pressing, top layers 14 are placed together, one on top of another, and all of top layers 14 are juxtaposed against bottom layer 16. FIG. 4 illustrates a particular example of array 10 which includes three of top layers 14 that are labeled 14a, 14b, and 14c. In addition, sheets 28 and 30 are juxtaposed with substrate 38 so that substrate 38 resides between sheets 28 and 30. In particular, sheet 28 resides adjacent to one of top layers 14 and sheet 30 resides adjacent to bottom layer 16.

Moreover, top layers 14, sheet 28, and sheet 30 are positioned so that holes 32 and 34 therein are substantially aligned across the entire hole pattern of array 10. When hundreds or thousands of holes 32 and 34 have been formed in each of top layers 14, sheet 28, and sheet 30, each hole in one of top layers 14, sheet 28, and sheet 30 is substantially aligned with corresponding holes in the other ones of top layers 14, sheet 28, and sheet 30. As a result of this alignment, the centers of corresponding holes 32 and 34 are generally positioned along common axes extending perpendicular to top and bottom layers 14 and 16, such as dotted line 40 shown in FIG. 4.

After the alignment, top layers 14, bottom layer 16, and sheets 28 and 30 are pressed together in a conventional press (not shown). When green ceramic is used for material 18, nominal compression pressures of around 3000 psi are suitable for laminating layers 14, 16. However, this nominal pressure may be increased when the combined fired thicknesses of top layers 14 exceed the thickness of die 20, and this nominal pressure may be slightly decreased when the combined fired thicknesses of top layers 14 are less than the thickness of die 20. Thus, by making lamination pressure responsive to the thickness of die 20, the combined fired thicknesses of top layers 14 more closely equals the thickness of die 20.

Holes 32 and 34 in non-stick sheets 28 and 30, respectively, serve to minimize distortion of material 18 during the lamination process. In particular, since holes 32 in sheet 28 are generally the same size and shape as holes 32 in top layers 14, and since holes 32 in sheet 28 are aligned with holes 32 in top layers 14, no significant tapering or deforming of material 18 occurs at the intersection between a top surface 42 of substrate 38 and cavity walls 36. Top surface 42 represents the exterior surface of the outermost one of top layers 14.

Likewise, since a wide gap in sheet 30 at hole 34 occurs underneath bottom layer 16, no significant lamination pressure is applied to bottom layer 16 in the vicinity of a cavity floor 44 of substrate 38. Cavity floor 44 represents the portion of the top surface of bottom layer 16 which resides underneath holes 32 in top layers 14. Cavity walls 36 of top layers 14 and cavity floor 44 of bottom layer 16 completely surround a cavity 46 in substrate 38, except for an opening 48 at top surface 42.

Due to the absence of significant lamination pressures in the vicinity of cavity floor 44, floor 44 remains in a substantially flat configuration. Thus, after lamination, cavity floor 44 remains substantially parallel to top surface 42 in the vicinity of each of cavities 46 in array 10. The thickness of layer 16 may be chosen to minimize any tendency for cavity floor 44 to form a dome within cavity 46. This is an important aspect of the present invention since it is very desirable that floor 44 of cavity 46 remain flat.

After the completion of the laminating stage depicted in FIG. 4, substrate 38 is removed from the press and sheets 28 and 30 are removed from substrate 38. During a fourth stage in the formation process, substrate 38 is conveniently heated or fired in a kiln at a relatively low temperature. In particular, substrate 38 is first heated at a very low temperature to burn off organic binders within substrate 38. Then, the temperature is raised, and a curing temperature which is preferably in the range of 700° C.-1200° C. and nominally around 860° C. is maintained for a predetermined period of time.

All dimensions, including the thickness dimension, of substrate 38 shrink as a result of firing substrate 38. As discussed above, the combined fired thicknesses of top layers 14 is desirably as close to the thickness of die 20 as is practical. This combined fired thickness represents the distance that cavity walls 36 extend into the interior of substrate 38 between top surface 42 and cavity floor 44. In other words, it represents the height of cavity walls 36.

To insure even closer matching between the height of cavity walls 36 and the thickness of die 20, the temperature at which substrate 38 is fired may desirably be increased from the nominal temperature when the height of cavity walls 36 would otherwise exceed the thickness of die 20. That way, additional shrinking beyond the nominal amount occurs. Alternatively, the temperature at which substrate 38 is fired may desirably be decreased from the nominal temperature when the height of cavity walls 36 would otherwise be less than the thickness of die 20. That way, less shrinking than the nominal amount occurs. By making firing temperature responsive to the thickness of die 20, the height of cavity walls 36 may more closely equal the thickness of die 20.

Figure 5:
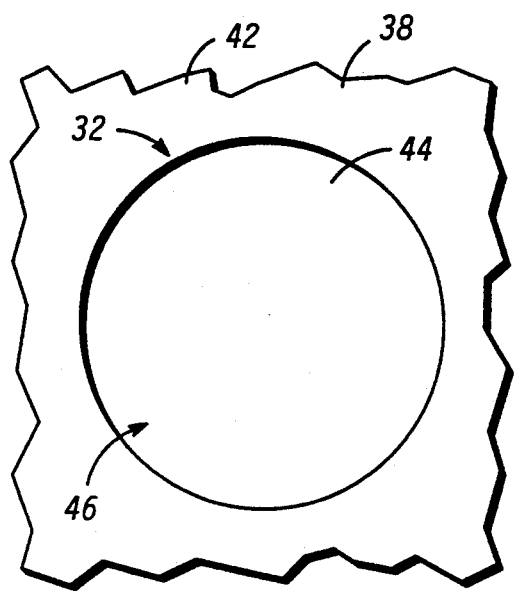
FIG. 5 shows a partial top view of a first embodiment of the array of carriers after a fourth stage.
Figure 6:
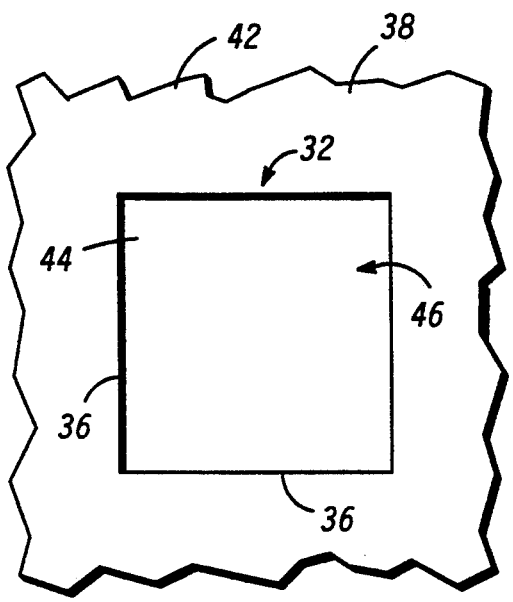
FIG. 6 shows a partial top view of a second embodiment of the array of carriers after the fourth stage.
Figure 7:
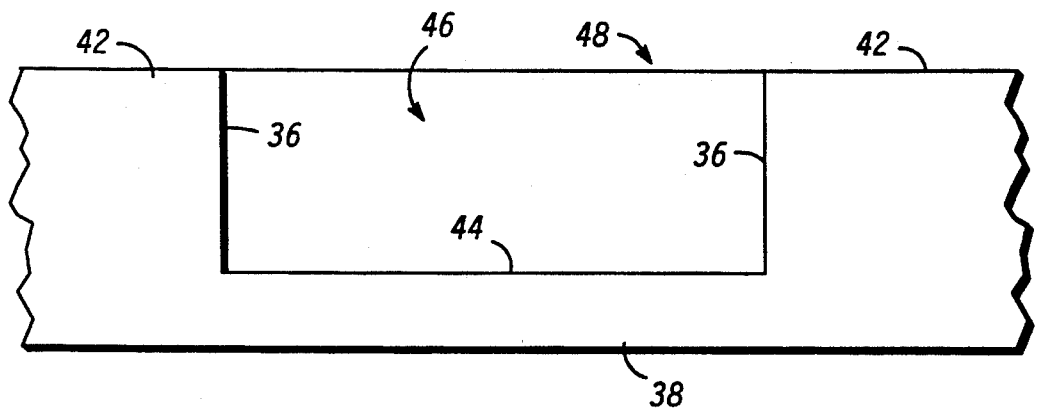
FIG. 7 shows a partial cross sectional side view of the array of carriers after the fourth stage.

FIG. 5 shows a partial top view of a first embodiment of array 10 of carriers 12 after firing. FIG. 6 shows a partial top view of a second embodiment of array 10 of carriers 12 after firing, and FIG. 7 shows a partial cross sectional side view of array 10 of carriers 12 after firing. The first and second embodiments depicted in FIGS. 5 and 6 differ only in the shape of holes 32 formed above in the third stage, discussed above in connection with FIG. 3. The FIG. 5 embodiment has a generally cylindrical cavity 46 while the FIG. 6 embodiment has a generally rectangular cavity 46. As illustrated in FIG. 7, substrate 38 is an integral unit after firing. Of course, substrate 38 includes numerous cavities 46 throughout array 10, rather than the single cavity depicted in FIGS. 5-7.

While the use of green ceramic sheets and the firing steps needed to convert them to a cured condition are desirable, those of skill in the art will understand based on the description herein, that other insulating materials (e.g. glass, fiberglass, plastic, filled plastics, etc.) may also be used for material 18 and laminated according to well known procedures appropriate for such other materials. Persons of skill in the art will understand how to perform such laminations without experimentation based on the description herein. Thus, stage four (firing or curing) is optional depending upon the mature of material 18.

Figure 8:
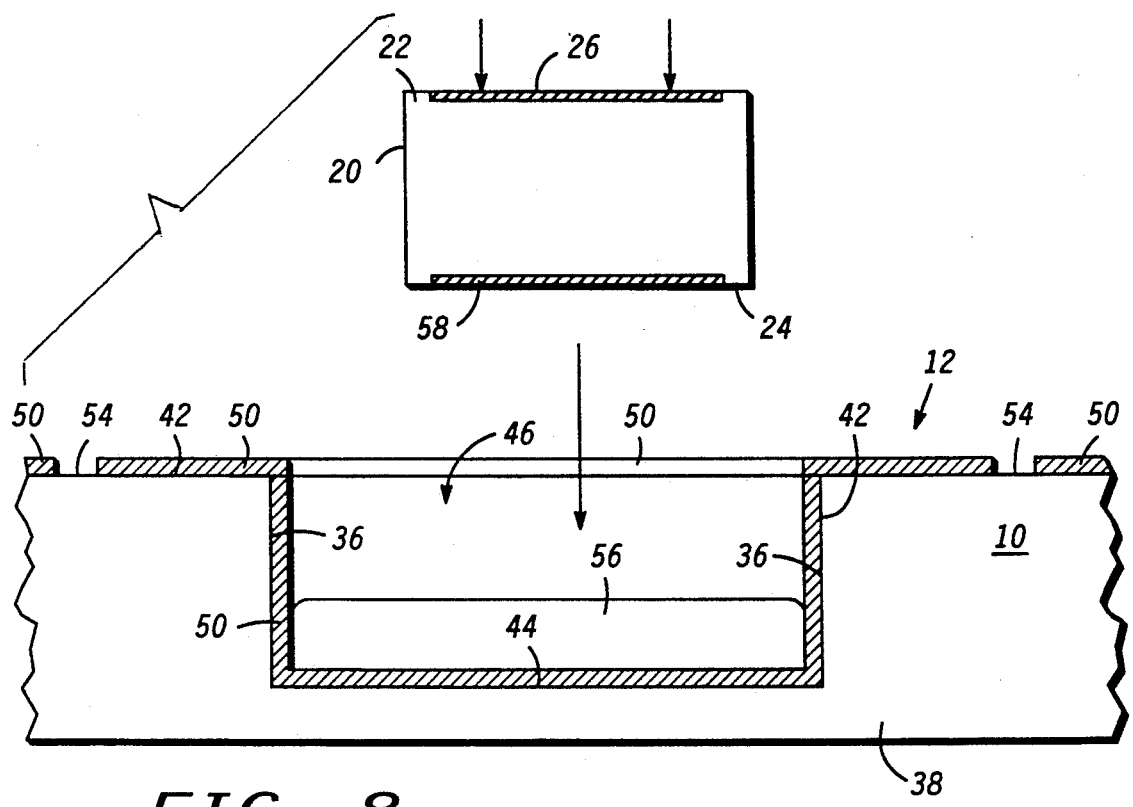
FIG. 8 shows a partial cross sectional side view of the array of carriers and the die at a fifth stage.

FIG. 8 shows a partial cross sectional side view of array 10 of carriers 12 and of die 20 at a fifth stage in the formation process. This fifth stage includes at least three separate tasks. In a first task, a metallization layer 50 is applied to substrate 38 from top surface 42. As a result of this metallization task, a continuous conductive coating of a desired metal overlies cavity floor 44, cavity walls 36, and top surface 42 of substrate 38. Conventional metallization processes are contemplated in this fifth stage, with conventional thin film evaporation or sputter deposition processes being preferred.

A second task performed during this fifth stage etches a pattern in metallization layer 50 overlying top surface 42 of substrate 38. Preferably, the etched pattern removes metallization layer 50 in a grid pattern 54 which defines the boundaries of individual carriers 12 in array 10. Metallization layer 50 remains on top surface 42 of substrate 38 close to and surrounding cavity 46. However, throughout array 10 the portions of metallization 50 which are associated with individual carriers 12 are now electrically isolated from one another. FIG. 8 depicts grid pattern 54 as areas on top surface 42 of substrate 38 where metallization layer 50 has been removed. Conventional patterning processes are contemplated in this fifth stage. For example, grid pattern 54 may be formed by applying photoresist (not shown) over top surface 42, applying a mask (not shown) which defines grid pattern 54 to the photoresist, then applying an etchant (not shown) to the mask to remove layer 50 through the mask in the vicinity of pattern 54.

In an alternate embodiment, numerous arrays 10 having a variety of cavity wall heights may be constructed through the patterning task and then held in inventory until a need exists in connection with a particular semiconductor die 20 having a particular thickness. Once this thickness is known, an array 10 having an appropriately sized cavity wall height may be selected from the inventory and processing continued from that point.

A third task in this fifth stage places die 20 into cavity 46. However, prior to placing die 20 into cavity 46 a measured amount of a conductive bonding material 56 is applied in cavity 46. The volume of bonding material 56 applied in each cavity 46 is preferably less than the volume of cavity 46 minus the volume of die 20. The substance used for bonding material 56 is not a critical parameter in the present invention. Bonding material 56 is conveniently an electrical conductor. Desirably, bonding material 56 can withstand the temperatures which it is likely to encounter in subsequent processing stages. For example, conventional conductive epoxies or gold-tin solders are useful for bonding material 56, but other well known bonding materials may also be used.

Die 20 is then placed in cavity 46. In the preferred embodiments, die 20 is laced in cavity 46 by conventional automated pattern recognition equipment which can achieve any desired orientation between die 20 and cavity 46. By placing die 20 in cavity 46, a contact 58 on bottom active surface 24 of die 20 becomes electrically coupled through conductive bonding material 56 to the portion of conductive layer 50 which overlies cavity floor 44. Through the portion of conductive layer 50 overlying cavity walls 36, contact 58 becomes electrically coupled to the portion of conductive layer 50 overlying top surface 42 of substrate 38.

After placing die 20 in cavity 46, active surface 22 of die 20 faces the same direction as top surface 42 of substrate 38. Likewise, contacts 26 face the same direction as conductive layer 50 overlying top surface 42 of substrate 38. This placing task takes place throughout array 10. If desired, testing may then be performed by applying test probes throughout array 10 to the generally flat surfaces of contacts 26 and layer 50 overlying top surface 42.

Figure 9:
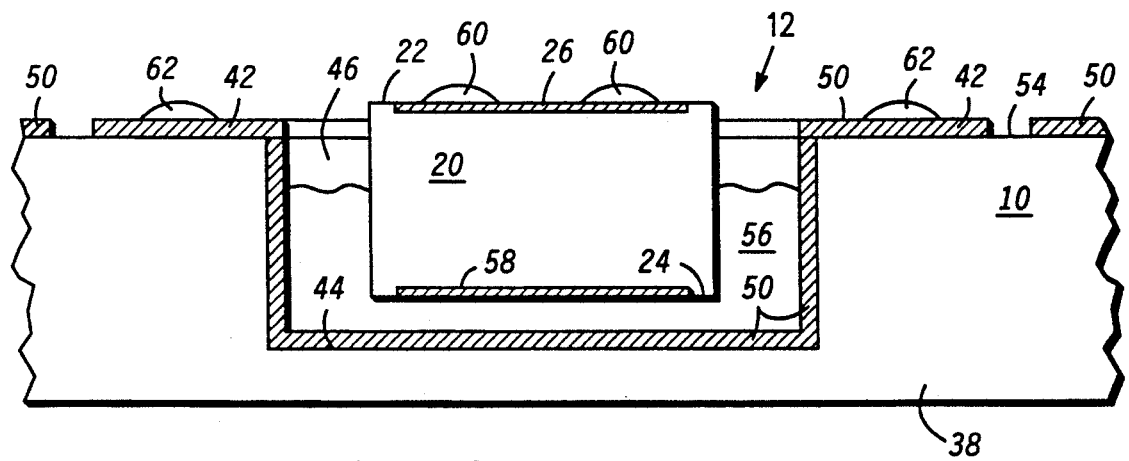
FIG. 9 shows a partial cross sectional side view of a portion of the array of carriers and the die after the fifth stage.

FIG. 9 shows a partial cross sectional side view of a portion of array 10 of carriers 12 and of die 20 after a sixth stage in the formation process. Die 20 now resides within cavity 46, and bonding material 56 now resides between contact 58 on active surface 24 of die 20 and conductive layer 50 overlying cavity floor 44. Those skilled in the art will appreciate that FIG. 9 depicts the distance between surface 24 and conductive layer 50 in an exaggerated state for clarity. Top active surface 22 of die 20 is approximately planar with layer 50 overlying top surface 42 of substrate 38. However, absolutely precise planarity is not required and a slight difference between the thickness of die 20 and the height of cavity walls 36 may cause top active surface 22 to be positioned slightly above or below the top of layer 50 overlying top surface 42 of substrate 38. Any distance difference is preferably less than 2.5 mils, more preferably less than 1.75 mils, and most preferably close to 0.0 mils.

In the preferred embodiment of the present invention, conductive bumps 60 are applied to top active surface 22 of die 20 and conductive bumps 62 are applied to conductive layer 50 overlying top surface 42 of substrate 38 during this sixth stage. Conventional conductive bumps are contemplated. Bumps 60 and 62 may be formed from solder or from other metals. One example of such an alternate conductive bump metal may be an alloy made from gold and a metal from the platinum family, such as platinum or palladium or iridium. Conductive bumps 60 and 62 preferably extend upward from their respective surfaces for a distance in the 3.0–6.0 mils range, with each of bumps 60 and 62 extending upward for substantially the same distance. The placement of conductive bumps 60 and 62 is discussed below in connection with FIG. 10.

Figure 10:
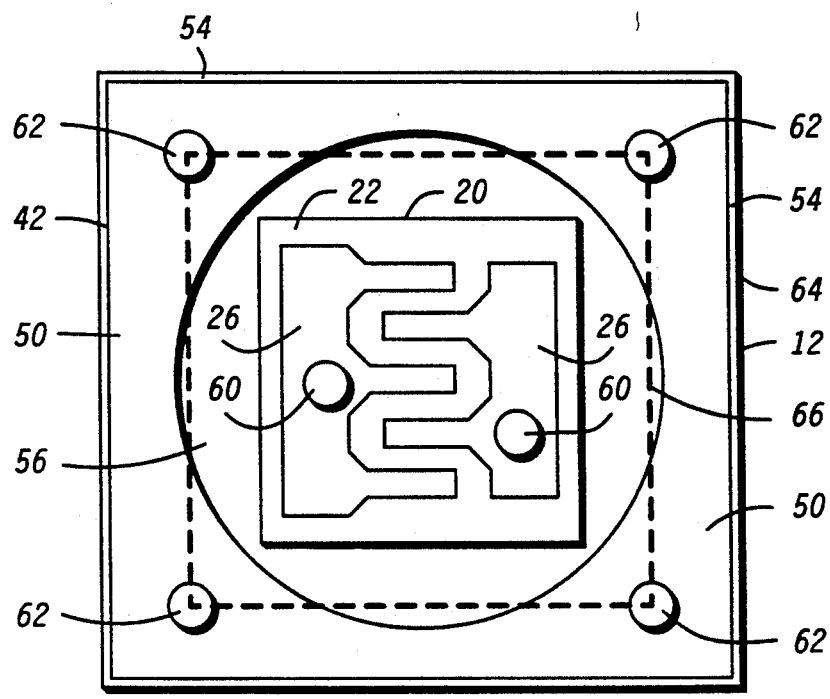
FIG. 10 shows a top view of the carrier and die after a sixth stage.

FIG. 10 shows a top view of a single carrier 12 and die 20 after a seventh stage in the formation process. In the seventh stage, carriers 12 are separated from array 10. Conventional wafer sawing processes are contemplated, and grid pattern 54 may serve as a guide in cutting array 10 into carriers 12. Each carrier 12 and die 20 installed therein together form a semiconductor assembly 64.

Conductive bumps 60 and 62 form substantially planar contacts for semiconductor assembly 64. Conductive bumps 60 are placed at desirable locations on contacts 26 of die 20. At least one bump 60 is installed on each contact 26. Of course, die 20 may have only one contact 26 on top surface 22 and only one conductive bump 60.

Conductive bumps 62 are desirably positioned in a pattern which contributes to the mechanical stability of semiconductor assembly 64 when installed on a printed wiring board. In particular, preferably at least three conductive bumps 62 are formed on layer 50, and bumps 62 are positioned so that they reside at the corners of a polygon having a center that coincides with the center of cavity 46. FIG. 10 illustrates four of bumps 62 positioned at the corners of a square 66, which is depicted by dotted lines. Where assembly 64 is to be inverted and attached to a subsequent circuit board by reflow of solder bumps 60, 62 it is desirable to have the weight of assembly 64 be shared approximately evenly among bumps 60, 62. In this fashion, assembly 64 does not tilt as the solder in bumps 60, 62 softens during reflow.

Figure 11:
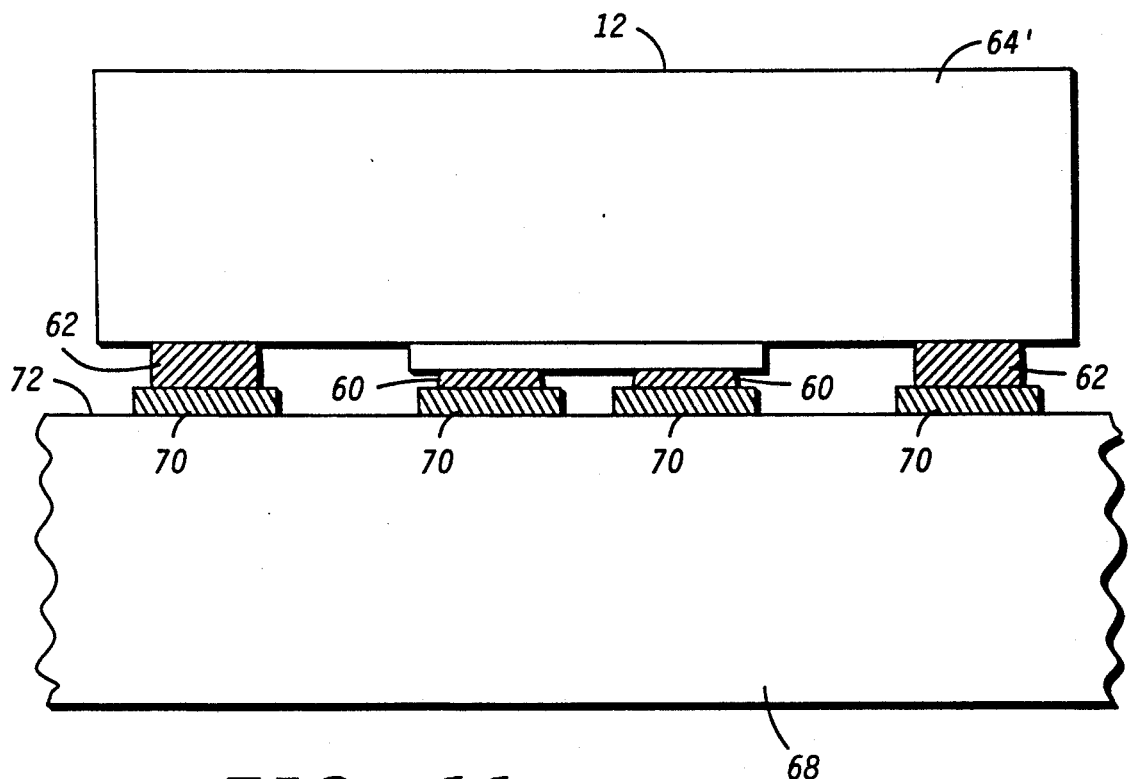
FIG. 11 shows a side view of the carrier and die after a seventh stage.

FIG. 11 shows a side view of semiconductor assembly 64 after an seventh stage. At this seventh stage, a printed wiring board 68 has been constructed using conventional techniques. Conductive pads 70 are formed on a surface 72 of board 68 in a conventional manner. In other words, pads 70 may be formed by screen printing, etching, or the like. Moreover, pads 70 are configured to mate with various ones of conductive bumps 60 and 62 formed on semiconductor assembly 64. Of course, other conductive traces may also be formed to interconnect through pads 70 to semiconductor assembly 64.

When printed wiring board 68 has been formed, semiconductor assembly 64 is attached to board 68. A conventional thermal compression welding process may desirably be used to achieve the attachment. Thus, temperature is raised slightly while compressing board 68 and assembly 64. The compression pressure causes conductive bumps 60 and 62 to compress and deform. Any lack of precise planarity between bumps 60 and bumps 62 is compensated for because the most outward extending ones of bumps 60 and 62 compress further than the others. Bumps 60 and 62 may compress a needed amount to allow the closer one of die 20 and carrier 12 to reside as close as 1.0 mil away from board 68.

Due to the pattern of multiple conductive bumps 62 near the periphery of assembly 64, assembly 64 rigidly attaches to board 68. Normal subsequent handling or processing of printed wiring board 68 will not cause relative movement between assembly 64 and board 68. Thus, the integrity of the mechanical and electrical connection between assembly 64 and board 68 will be maintained.

In summary, the present invention provides an improved carrier for a semiconductor die having non-coplanar contacts. The carrier converts the die's non-coplanar contacts into an assembly having planar contacts. A cavity wall height dimension of the carrier may be adjusted to accommodate a variety of semiconductor die thicknesses. The carrier allows a semiconductor die having non-coplanar contacts to be mounted to a printed wiring board using a flip chip technique. Due to the flip chip, conductive bump attachment technique used by the present invention, only a small amount of printed wiring board area is consumed by the semiconductor assembly.

The present invention has been described above with reference to preferred embodiments. However, those skilled in the art will recognize that changes and modifications may be made in these preferred embodiments without departing from the scope of the present invention. For example, those skilled in the art can devise alternate substrate materials and dimensions which are suitable for particular applications. These and other changes and modifications which are obvious to those skilled in the art based on the explanation herein are intended to be included within the scope of the present invention. Moreover, those skilled in the art will appreciate that directional terms, such as top, bottom, floor, underneath, and the like, have been used herein for clarity of explanation in connection with the Figures. The present invention has no need or requirement for any particular orientation relative to the force exerted by gravity, and no such orientation is to be implied.

What is claimed is:

1. A carrier for substantially leveling non-coplanar semiconductor die contacts, said carrier comprising:
   a substrate having an external surface and a cavity therein, said cavity being bordered by cavity walls of said substrate that extend from said external surface a predetermined distance into an interior of said substrate and being bordered by a cavity floor of said substrate that extends between said cavity walls;
   an electrically continuous conductive layer having a first portion overlying said cavity floor, a second portion on said cavity walls, and a third portion on said external surface such that said first portion is electrically coupled to said third portion via said second portion of said conductive layer;
   a semiconductor die having first and second active contacts located respectively on first and second non-coplanar surfaces, and wherein said cavity is dimensioned so that said semiconductor die fits within said cavity, said first active contact being electrically coupled to said first portion of said conductive layer, and said second active contact being approximately co-planar with said third portion of said conductive layer; and
   a first conductive bump positioned on said third portion of said conductive layer, said first conductive bump being electrically coupled to said first active contact of said semiconductor die by said conductive layer.

2. A carrier for substantially leveling non-coplanar semiconductor die contacts, said carrier comprising:
   a substrate having an external surface and a cavity therein, said cavity being bordered by cavity walls of said substrate that extend from said external surface a predetermined distance into an interior of said substrate and being bordered by a cavity floor of said substrate that extends between said cavity walls;
   an electrically continuous conductive layer having a first portion overlying said cavity floor, a second portion on said cavity walls, and a third portion on said external surface such that said first portion is electrically coupled to said third portion via said second portion of said conductive layer;
   a semiconductor die having first and second active contacts located respectively on first and second non-coplanar surfaces, and wherein said cavity is dimensioned so that said semiconductor die fits within said cavity, said first active contact being electrically coupled to said first portion of said conductive layer, and said second active contact being approximately co-planar with said third portion of said conductive layer;

a first conductive bump positioned on said third portion of said conductive layer, said first conductive bump being electrically coupled to said first active contact of said semiconductor die by said conductive layer; and second and third conductive bumps, each of which overlie said third portion of said conductive layer and wherein said first, second and third conductive bumps are mutually positioned at corners of a polygon having at least a portion of said cavity located therein.

3. An assembly having substantially planar contacts, said assembly comprising:

a substrate having an external surface and a cavity therein, said external surface being substantially flat and residing in a plane, said cavity being bordered by cavity walls of said substrate that extend from said external surface a predetermined distance into an interior of said substrate and being bordered by a cavity floor of said substrate that extends between said cavity walls;

a substantially continuous conductive layer having a first portion overlying at least a portion of said cavity floor, a second portion on at least a portion of said cavity walls, and a third portion on a portion of said external surface such that said first portion is electrically coupled to said third portion by said second portion;

a die having first and second active contacts, located on first and second non-coplanar surfaces respectively, said semiconductor die residing within said cavity so that said first active contact is electrically coupled to said first portion of said conductive layer and said second contact is approximately co-planar with said third portion of said conductive layer;

a first conductive bump positioned on said second active contact of said die; and a second conductive bump overlying said third portion of said conductive layer, said second conductive bump electrically coupled to said first active contact of said semiconductor die by said conductive layer.

4. An assembly having substantially planar contacts, said assembly comprising:

a substrate having an external surface and a cavity therein, said external surface being substantially flat and residing in a plane, said cavity being bordered by cavity walls of said substrate that extend from said external surface a predetermined distance into an interior of said substrate and being bordered by a cavity floor of said substrate that extends between said cavity walls;

a substantially continuous conductive layer having a first portion overlying at least a portion of said cavity floor, a second portion on at least a portion of said cavity walls, and a third portion on a portion of said external surface such that said first portion is electrically coupled to said third portion by said second portion;

a die having first and second active contacts, located on first and second non-coplanar surfaces respectively, said semiconductor die residing within said cavity so that said first active contact is electrically coupled to said first portion of said conductive layer and said second contact is approximately co-planar with said third portion of said conductive layer;

a first conductive bump positioned on said second active contact of said die;

a second conductive bump overlying said third portion of said conductive layer, said second conductive bump electrically coupled to said first active contact of said semiconductor die by said conductive layer; and at least third and fourth conductive bumps, each of said at least third and fourth conductive bumps overlying said third portion of said conductive layer so that said second conductive bump and said third and fourth conductive bumps are mutually positioned at corners of a polygon having at least a portion of said cavity located therein.

5. An assembly as claimed in claim 3 wherein said substrate comprises:

a first substantially continuous planar member having a surface which serves as said cavity floor; and a second substantially continuous planar member having a hole extending between opposing surfaces thereof, said first and second substantially continuous planar members being formed into an integral unit.

6. An assembly as claimed in claim 5 wherein said second substantially continuous planar member comprises a plurality of layers, each layer of said plurality of layers having a hole therethrough, and said holes being aligned along an axis substantially perpendicular to said layers.

7. An assembly as claimed in claim 3 wherein said cavity floor extends substantially parallel to said external surface of said substrate.

8. A carrier for leveling non-coplanar semiconductor die contacts as claimed in claim 1 wherein said semiconductor die is a transistor additionally having a third active contact located on said second non-coplanar surface of said semiconductor die, said transistor having an emitter node, a base node and a collector node, said collector node corresponding to said first active contact, said base node corresponding to second active contact and said emitter node corresponding to said third active contact.

9. A carrier for leveling non-coplanar semiconductor die contacts, as claimed in claim 1 wherein said substrate comprises ceramic material.

10. A carrier for leveling non-coplanar semiconductor die contacts as claimed in claim 1 wherein said substrate comprises:

a first substantially continuous planar member having a surface which serves as said cavity floor; and a second substantially continuous planar member having a hole extending between opposing surfaces thereof, said first and second planar members being formed into an integral unit.

11. A carrier for leveling non-coplanar semiconductor die contacts as claimed in claim 10 wherein said second substantially continuous planar member comprises a plurality of layers, each layer of said plurality of layers having a hole therethrough, and said holes being aligned along an axis substantially perpendicular to said layers.

12. A carrier for leveling non-coplanar semiconductor die contacts as claimed in claim 1 wherein said cavity floor and said external surface of said substrate are substantially parallel.

13. A carrier for leveling non-coplanar semiconductor die contacts as claimed in claim 1 wherein said cavity floor is substantially flat.

14. A carrier for leveling non-coplanar semiconductor die contacts as claimed in claim 1 wherein said external surface and said second surface of said semiconductor die are co-planar within a range of ±2.5 mils.

15. An assembly as claimed in claim 3 wherein said second active contact of said semiconductor die and said third portion of said continuous layer are co-planar to within ±2.5 mils.

16. An assembly as claimed in claim 3 additionally comprising a conductive bonding material located between said semiconductor die and said first portion of said conductive layer said conductive bonding material electrically coupling said first active contact to said first portion of said conductive layer.

* * * * *